(12) United States Patent
Zhou

(10) Patent No.: US 12,089,478 B2
(45) Date of Patent: Sep. 10, 2024

(54) DISPLAY PANEL AND DISPLAY DEVICE

(71) Applicant: Wuhan China Star Optoelectronics Semiconductor Display Technology Co., Ltd., Wuhan (CN)

(72) Inventor: Sisi Zhou, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 992 days.

(21) Appl. No.: 16/958,759

(22) PCT Filed: Mar. 30, 2020

(86) PCT No.: PCT/CN2020/081969
§ 371 (c)(1),
(2) Date: Jun. 29, 2020

(87) PCT Pub. No.: WO2021/168980
PCT Pub. Date: Sep. 2, 2021

(65) Prior Publication Data
US 2023/0095920 A1    Mar. 30, 2023

(30) Foreign Application Priority Data

Feb. 28, 2020   (CN) .......................... 202010127373.0

(51) Int. Cl.
*H10K 59/80*     (2023.01)
*H10K 59/124*    (2023.01)
*H10K 59/173*    (2023.01)

(52) U.S. Cl.
CPC ......... *H10K 59/873* (2023.02); *H10K 59/124* (2023.02); *H10K 59/173* (2023.02)

(58) Field of Classification Search
CPC ... G06F 1/1637; G06F 1/1686; H10K 59/873; H10K 59/122; H10K 59/173; H10K 59/124
See application file for complete search history.

(56) References Cited

U.S. PATENT DOCUMENTS

| | | | |
|---|---|---|---|
| 10,135,020 B1* | 11/2018 | Zhang | ............. H10K 59/00 |
| 2019/0280248 A1* | 9/2019 | Kwon | ............. H10K 59/1201 |
| 2020/0033728 A1* | 1/2020 | Ishikawa | ............. G03F 7/032 |

(Continued)

FOREIGN PATENT DOCUMENTS

| | | |
|---|---|---|
| CN | 110010665 | 7/2017 |
| CN | 109616506 | 4/2019 |
| CN | 109638019 | 4/2019 |

(Continued)

*Primary Examiner* — Vongsavanh Sengdara
(74) *Attorney, Agent, or Firm* — PV IP PC; Wei Te Chung

(57) ABSTRACT

A display panel and a display device are provided. The display panel includes a display region, a perimeter region, and a hole region. The display panel further comprises an inorganic insulating layer, an organic insulating layer, an organic light emitting layer and a film packaging layer stacked. The organic light emitting layer is disposed correspondingly to the display region. At least one ring groove is defined in the inorganic insulating layer and/or the organic insulating layer corresponding to the perimeter region. A portion of the film packaging layer corresponding to the ring groove is closely contacted to the inorganic insulating layer and/or the organic insulating layer.

15 Claims, 2 Drawing Sheets

(56) References Cited

U.S. PATENT DOCUMENTS

2020/0119304 A1\* 4/2020 Choi .................. H10K 59/87
2020/0194714 A1\* 6/2020 Won ................... H10K 59/123

FOREIGN PATENT DOCUMENTS

| | | |
|---|---|---|
| CN | 110021642 | 7/2019 |
| CN | 110137370 | 8/2019 |
| CN | 110444576 | 11/2019 |
| CN | 110518141 | 11/2019 |
| CN | 110660826 | 1/2020 |
| CN | 112913043 | 6/2021 |
| WO | WO 2020/027418 | 2/2020 |

\* cited by examiner

DISPLAY PANEL AND DISPLAY DEVICE

RELATED APPLICATIONS

This application is a National Phase of PCT Patent Application No. PCT/CN2020/081969 having International filing date of Mar. 30, 2020, which claims the benefit of priority of Chinese Patent Application No. 202010127373.0, filed on Feb. 28, 2020. The contents of the above applications are all incorporated by reference as if fully set forth herein in their entirety.

FIELD AND BACKGROUND OF THE INVENTION

The present application relates to the field of display, and particularly to a display panel and a display device.

With an increase in consumer demand for screen ratio, an under-screen camera type OLED display panel has become a mainstream design solution in the field of OLED display panels. Usually, the under-screen camera type OLED display panel is provided with a hole region in the display region, a through hole is formed by cutting a corresponding portion in the hole region, a camera component disposed at a back of the OLED display panel is exposed, thereby forming an under-screen camera. When cutting the through hole, a cutting surface makes a side of the organic light emitting layer exposed to air, allowing moisture and oxygen to seep in from the side of the organic light emitting layer and causing package failure.

Therefore, the existing technology has deficiencies and urgently needs to be resolved.

SUMMARY OF THE INVENTION

The present application provides a display panel and a display device to solve a problem of that when cutting the through hole in an under-screen camera type OLED display panel, a cutting surface makes a side of the organic light emitting layer exposed to air, moisture and oxygen will seep from the side of the organic light emitting layer and cause package failure.

In order to solve the above problem, the technical proposal provided in this application is as follows:

The present application provides a display panel comprising a display region, a perimeter region, and a hole region, the perimeter region surrounds the hole region, the display region surrounds the perimeter region;

wherein the display panel further comprises an inorganic insulating layer, an organic insulating layer, an organic light emitting layer and a film packaging layer stacked on a base substrate, the organic light emitting layer is disposed correspondingly to the display region, the film packaging layer comprises an inorganic layer and an organic layer stacked;

wherein at least one ring groove is defined in the inorganic insulating layer and/or the organic insulating layer corresponding to the perimeter region, a portion of the film packaging layer corresponding to the ring groove closely contacts to the inorganic insulating layer and/or the organic insulating layer through a side wall and a bottom of the ring groove, a boundary of the organic layer is disposed out of the hole region.

In the display panel of the present application, the boundary of the organic insulating layer is disposed at a side of the ring groove near the display region, the ring groove is defined in the inorganic insulating layer, the portion of the film packaging layer corresponding to the ring groove closely contacts to the inorganic insulating layer through the side wall and the bottom of the ring groove.

In the display panel of the present application, a portion of the inorganic insulating layer near the hole region is a stepped structure.

In the display panel of the present application, the boundary of the organic layer is disposed in the ring groove, or the boundary of the organic layer is disposed at the side of the ring groove near the display region.

In the display panel of the present application, an cross-sectional width of an opening of the ring groove is less than an cross-sectional width of the bottom.

In the display panel of the present application, at least two ring grooves are alternately arranged from a position near the hole region to a position away from the hole region.

In the display panel of the present application, the organic insulating layer comprises a planarizing layer, a pixel defining layer, and a spacer layer stacked, the inorganic insulating layer comprises a buffer layer, a gate insulating layer, and an interlayer insulating layer, the ring groove penetrates at least one of the planarizing layer, the pixel defining layer, the spacer layer, the buffer layer, the gate insulating layer, and the interlayer insulating layer.

In the display panel of the present application, the side wall of the ring groove is a flat or a curved surface or a stepped structure.

The present application provides a display device comprising the display panel of the above and a camera component, wherein the hole region is disposed in a position of the display panel corresponding to the camera component;

wherein the display panel further comprises a display region, and a perimeter region, the perimeter region surrounds the hole region, the display region surrounds the perimeter region;

wherein the camera component is disposed on a back of the display panel corresponding to the hole region, the camera component is configured for photographing objects positioned at a side of the display panel facing away from the camera component.

In order to solve the above problem, the present application provides a display panel comprising a display region, a perimeter region, and a hole region, wherein the perimeter region surrounds the hole region, the display region surrounds the perimeter region;

wherein the display panel further comprises an inorganic insulating layer, an organic insulating layer, an organic light emitting layer and a film packaging layer stacked on a base substrate, the organic light emitting layer is disposed correspondingly to the display region, the film packaging layer comprises an inorganic layer and an organic layer stacked;

wherein at least one ring groove is defined in the perimeter region of the inorganic insulating layer and/or the organic insulating layer, a boundary of the ring groove is one or a group selected from a straight line, an arc line, and a polyline, a portion of the film packaging layer corresponding to the ring groove closely contacts to the inorganic insulating layer and/or the organic insulating layer through a side wall and a bottom of the ring groove, a boundary of the organic layer is disposed out of the hole region.

In the display panel of the present application, the boundary of the organic insulating layer is disposed at a side of the ring groove near the display region, the ring groove is defined in the inorganic insulating layer, the portion of the film packaging layer corresponding to the ring groove closely contacts to the inorganic insulating layer through the side wall and the bottom of the ring groove.

In the display panel of the present application, a portion of the inorganic insulating layer near the hole region is a stepped structure.

In the display panel of the present application, the boundary of the organic layer is disposed in the ring groove, or the boundary of the organic layer is disposed at the side of the ring groove near the display region.

In the display panel of the present application, an cross-sectional width of an opening of the ring groove is less than an cross-sectional width of the bottom.

In the display panel of the present application, at least two ring grooves are alternately arranged from a position near the hole region to a position away from the hole region.

In the display panel of the present application, the organic insulating layer comprises a planarizing layer, a pixel defining layer, and a spacer layer stacked, the inorganic insulating layer comprises a buffer layer, a gate insulating layer, and an interlayer insulating layer, the ring groove penetrates at least one of the planarizing layer, the pixel defining layer, the spacer layer, the buffer layer, the gate insulating layer, and the interlayer insulating layer.

In the display panel of the present application, the side wall of the ring groove is a flat or a curved surface or a stepped structure.

The benefit of the present application is: the present application provides a display panel and a display device. The organic light emitting layer of a peripheral region of the hole region is removed in the present application, when cutting the through hole in the hole region, a side of the organic light emitting layer can not be exposed to air; and the ring groove is defined in the perimeter region to block the organic layer of the film packaging layer from moving, thereby making the film packaging layer closed to the hole region to be an inorganic stacked structure, and avoiding that moisture and oxygen will seep from the side of the organic light emitting layer and cause package failure.

BRIEF DESCRIPTION OF THE SEVERAL VIEWS OF THE DRAWINGS

Below in conjunction with the drawings, through a detailed description of the specific implementation of the present application, will make the technical solutions of the present application and other beneficial effects obvious.

DESCRIPTION OF SPECIFIC EMBODIMENTS OF THE INVENTION

Figure 1:
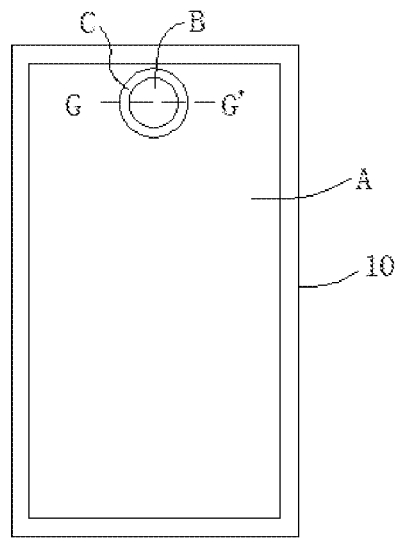
FIG. 1 is a structural schematic diagram of a display panel of one embodiment according to the present application.

The technical solutions in the embodiments of the present application will be clearly and completely described with reference to the accompanying drawings in the embodiments of the present application. Obviously, the described embodiments are only a part of the embodiments of the present application, but not all of the implementation example. Based on the embodiments in the present application, all other embodiments obtained by those skilled in the art without creative work fall into the protection scope of the present application.

In the description of this application, it should be understood: the terms "longitudinal", "transverse", "length", "width", "upper", "lower", "front", "back", "left", "right", "vertical", "horizontal", etc. of directions or positional relationships are based on the directions or positional relationships of the drawings, The directions or position relationships shown is only for the convenience of describing this application and simplifying the description, and does not indicate or imply that the device or element referred to have a specific orientation, structure and operation in a specific orientation, so it cannot be understood as limit. In addition, the terms "first" and "second" are used for descriptive purposes only, and should not be interpreted as indicating or implying relative importance or implicitly indicating the number of technical features indicated. Thus, "first", "second" features may explicitly or implicitly include one or more of the features. In the description of this application, the meaning of "multiple" is two or more, unless specifically defined otherwise. In this application, "/" means "or".

The present application may repeat reference numerals and/or reference letters in different examples. This repetition is for simplicity and clarity, and does not itself indicate the relationship between the various embodiments and/or settings discussed.

The present application is used to solve a problem, that when cutting a through hole in an under-screen camera type OLED display panel of the prior art, package failure occurs.

Figure 2:
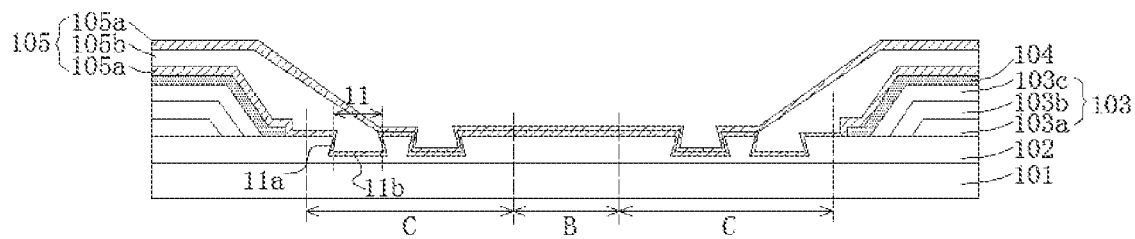
FIG. 2 is a cross sectional diagram of FIG. 1 taken along G-G'.

Referring to FIGS. 1 and 2, in order to increase the screen ratio, a display panel 10 of the present application is an under-screen camera type OLED display panel, which includes a display region A, a hole region B, and a perimeter region C. The perimeter region C surrounds the hole region B. The display region A surrounds the perimeter region C. A portion of the display panel 10 corresponding to the hole region B is used for cutting and forming a through hole exposing the under-screen camera.

The display panel 10 further includes an inorganic insulating layer 102, an organic insulating layer 103, an organic light emitting layer 104, and a film packaging layer 105 stacked on a base substrate 101. The organic light emitting layer 104 is disposed corresponding to the display region A. The film packaging layer 105 includes inorganic layers 105a and an organic layer 105b stacked.

At least one ring groove 11 is defined in the inorganic insulating layer 102 and/or the organic insulating layer 103 corresponding to the perimeter region C. A portion of the film packaging layer 105 corresponding to the ring groove 11 closely contacts to the inorganic insulating layer 102 and/or the organic insulating layer 103 through a side wall 11a and a bottom 11b of the ring groove 11. A boundary of the organic layer 105b is disposed out of the hole region B.

In the present application, a through hole defined in the hole region B penetrates or partly penetrates through one or more than one of the base substrate 101, the inorganic insulating layer 102, the organic insulating layer 103, and the film packaging layer 104.

The organic light emitting layer of a peripheral region of the hole region is removed in the present application, when cutting the through hole in the hole region, a side of the organic light emitting layer cannot be exposed to air; and the ring groove is defined in the perimeter region to block the organic layer of the film packaging layer from moving, thereby making the film packaging layer close to the hole region to be an inorganic stacked structure, and thus preventing moisture and oxygen from seeping in from the side of the organic light emitting layer and causing package failure.

In the following, the display panel of the present application is described in detail in conjunction with a specific embodiment, this embodiment only takes the ring groove formed on the inorganic insulating layer as an example for description.

Referring to FIG. 2, FIG. 2 is a cross sectional diagram of FIG. 1 taken along G-G'. The display panel 10 includes a base substrate 101, a plurality layers of inorganic insulating layers 102 formed on the base substrate 101, a plurality layers of organic insulating layers 103 formed on the inorganic insulating layers 102, a plurality layers of metal layers (not shown) formed between the inorganic insulating layers 102 and the organic insulating layers 103, a semiconductor layer (not shown) formed between the inorganic insulating layers 102, a pixel electrode layer (not shown) formed between the organic insulating layers 103, an organic light emitting layer 104 formed on the organic insulating layers 103, and a film packaging layer 105 formed on the organic light emitting layer 104.

The inorganic insulating layers 102 includes but not limited to a buffer layer, a gate insulating layer, and an interlayer insulating layer stacked. The organic insulating layer 103 includes but not limited to a planarizing layer 103a, a pixel defining layer 103b, and a spacer layer 103c.

In this embodiment, the boundary of the organic insulating layer 103 is disposed at a side of the ring groove 11 near the display region A. The ring groove 11 is defined in the inorganic insulating layer 102. The ring groove 11 penetrates through at least one of the buffer layer, the gate insulating layer, and the interlayer insulating layer.

The portion of the film packaging layer 105 corresponding to the ring groove 11 closely contacts to the inorganic insulating layer 102 through the side wall 11a and the bottom 11b of the ring groove 11.

Because the organic light emitting layer 104 is disposed corresponding to the display region A, the film packaging layer 105 corresponding to the hole region B and the perimeter region C surrounding the hole region B closely contact to the inorganic insulating layer 102. The film packaging layer 105 includes at least one of a three layers stacked structure of an inorganic layer 105a, an organic layer 105b, and the inorganic layer 105a. The inorganic layers 105a are formed an entire thin film in the perimeter region C and the hole region B of the ring groove 11.

The organic layer 105b is disposed out of the hole region B, that is, the organic layer 105b is disconnected out of the hole region B. When cutting the through hole in the hole region B, the organic layer 105b is not exposed to the air, thereby preventing moisture and oxygen from seeping into the display panel.

Further, the boundary of the organic layer 105b is disposed in the ring groove 11, the ring groove 11 can be used as a recessed barricade to block the organic layer 105b from moving, and makes the film packaging layer 105 of the ring groove 11 near the hole region B form an inorganic stacked structure, which closely contacts to the inorganic insulating layer 102 of thereunder to make inorganic film layers in the boundary of the hole region B, thereby preventing moisture and oxygen from seeping into the display panel and causing package failure.

In other embodiments, the boundary of the organic layer 105b is disposed at the side of the ring groove 11 near the display region A. The organic layer 105b maintains within an inner side of the ring groove 11 (near the display region A) to make a multi inorganic layer formed in and out of the ring groove 11 and (near the hole region B), thereby avoiding that moisture and oxygen will seep into the display panel and cause package failure.

In this embodiment, a cross-sectional width of an opening of the ring groove 11 is less than a cross-sectional width of the bottom, which can further strengthen the function of the ring groove 11 to block the organic layer 105b from moving. At least two ring grooves 11 are alternately arranged from a position near the hole region B o a position away from the hole region B, that is, a plurality layers of the ring grooves 11 are disposed in the perimeter region C.

On another hand, in the perimeter region C, a segment gap is defined between parts of the inorganic layer 105a corresponding to an outside of the ring groove 11 and corresponding to the bottom 11b of the ring groove 11 through the side wall 11a of the ring groove 11. That is, in the perimeter region C, an uphill is defined on the side wall 11a of the ring groove 11 by the inorganic layer 105a from a side near the hole region B to a side far away from the hole region B. Because a process temperature of the inorganic insulating layer 102 is about 370 □, a low temperature process is used for the inorganic layer 105a, and a process temperature of the inorganic layer 105a is about 100 □, a density of the inorganic insulating layer 102 is greater than a density of the inorganic layer 105a. Therefore, when cutting a part of the display panel corresponding to the hole region B, a crack occurring at a cutting position of the inorganic layer 105a can be stopped at the uphill, so the ring groove 11 can block the cracks from continuing to extend inward.

In this embodiment, a diameter of the ring groove 11 is 10 um-100 um greater than a diameter of the hole region B. In other embodiments, a shape of the hole region B can be a rectangle, a U-shape, or other shapes, and the shape of the hole region B is not limited to this, for example, can be a rectangle, or a polygon, etc.

In one embodiment, a boundary line of the ring groove 11 can be one or a group selected from a straight line, an arc, and a polyline.

In one embodiment, a rounded corner is defined between the side wall 11a and the bottom 11b of the ring groove 11 to make the inorganic layer 105a as a continuous thin film at the rounded corner between the side wall 11a and the bottom 11b of the ring groove 11, thereby ensuring an encapsulation effect of the film packaging layer 105.

In this embodiment, the side wall 11a of the ring groove 11 can be a plane, a cambered surface, or a stepped structure. If the side wall 11a is a stepped structure, an extension path of the crack extending from the bottom 11b to out of the ring groove 11 can be increased, thereby further preventing the crack from extending into the display panel.

In this embodiment, a portion of the inorganic insulating layer 102 near the hole region B is the stepped structure, thereby further preventing the crack from extending into the display panel.

The depths of at least two of the ring grooves 11 may be same or different. In one embodiment, the depth of the ring groove 11 is gradually increased from a side near the hole region B to a side far away from the hole region B, thereby further increasing a function of preventing the crack from extending.

Figure 3:
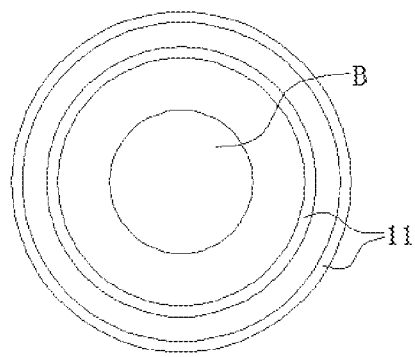
FIG. 3 is a top view of a perimeter region and a hole region of FIG. 2.

Referring to FIG. 3, FIG. 3 is a top view of the perimeter region and the hole region of FIG. 2. The ring groove 11 is disposed out of the hole region B.

In other embodiments, the boundary of the organic insulating layer 103 is disposed between the ring groove 11 and the hole region B. The ring groove 11 is disposed on the organic insulating layer 103 corresponding to the perimeter region C. The ring groove 11 penetrates through at least one of the planarizing layer, the pixel defining layer, and the spacer layer.

In other embodiments, the boundary of the organic insulating layer 103 is disposed between the ring groove 11 and the hole region B. The ring groove 11 is disposed on the organic insulating layer 103 and the inorganic insulating layer 102 corresponding to the perimeter region C. The ring groove 11 penetrates through at least one of the planarizing layer, the pixel defining layer, the spacer layer, the buffer layer, the gate insulating layer, and the interlayer insulating layer.

Figure 4:
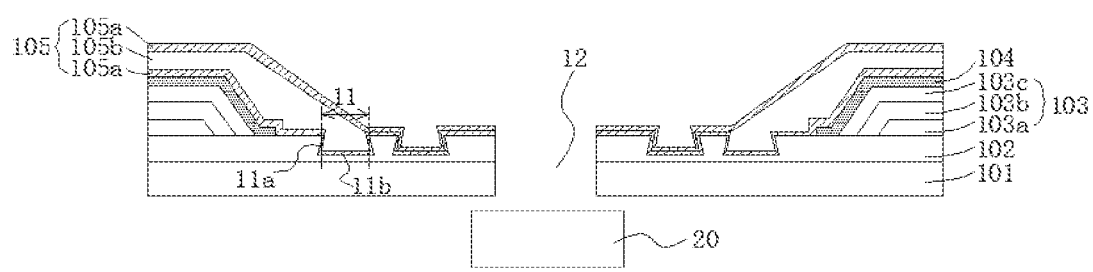
FIG. 4 is a cross sectional diagram of a display device of one embodiment according to the present application.

The present application provides a display device, referring to FIGS. 1 and 4, the display device includes the display panel 10 and a camera component 20. The display panel 10 includes a display region A, a hole region B, and a perimeter region C. The perimeter region C surrounds the hole region B. The display region A surrounds the perimeter region C. A portion of the display panel 10 corresponding to the hole region B is cut to form a through hole 12 penetrating through the portion of the display panel 10. The camera component 20 is disposed on a back of the display panel 10 corresponding to the through hole 12. The camera component 20 is configured for photographing objects positioned at a side of the display panel 10 facing away from the camera component 20.

For the structure of the display panel 10, please refer to the description in the above embodiment, and no more details are provided here.

The present application provides a display panel and a display device. The organic light emitting layer of a peripheral region of the hole region is removed in the present application, when cutting the through hole in the hole region, a side of the organic light emitting layer can not be exposed to air; and the ring groove is defined in the perimeter region to block the organic layer of the film packaging layer from moving, thereby making the film packaging layer closed to the hole region to be an inorganic stacked structure, and avoiding that moisture and oxygen will seep from the side of the organic light emitting layer and cause package failure.

In summary, although the present application has been disclosed as the preferred embodiments above, the above preferred embodiments are not intended to limit the present application. Those of ordinary skill in the art can do all without departing from the spirit and scope of the present application This kind of changes and retouching, so the scope of protection of this application shall be subject to the scope defined by the claims.

What is claimed is:

1. A display panel, having a display region, a perimeter region, and a hole region, wherein the perimeter region surrounds the hole region, and the display region surrounds the perimeter region;
   wherein the display panel comprises an inorganic insulating layer, an organic insulating layer, an organic light emitting layer and a film packaging layer stacked on a base substrate, the organic light emitting layer is disposed in the display region, and the film packaging layer comprises an inorganic layer and an organic layer stacked; and
   wherein at least one ring groove is formed in a portion of the inorganic insulating layer in the perimeter region, a boundary of the organic insulating layer is on a side of the ring groove close to the display region, a portion of the film packaging layer corresponding to the ring groove is joined to the inorganic insulating layer through a side wall of the ring groove and a bottom of the ring groove, and a boundary of the organic layer is out of the hole region,
   the at least one ring groove comprises a plurality of ring grooves, and depths of the plurality of ring grooves are gradually increased from a side near the hole region to a side far away from the hole region.

2. The display panel of claim 1, wherein a portion of the inorganic insulating layer close to the hole region is a stepped structure.

3. The display panel of claim 1, wherein the boundary of the organic layer is in the ring groove, or the boundary of the organic layer is on the side of the ring groove close to the display region.

4. The display panel of claim 1, wherein a cross-sectional width of an opening of the ring groove is less than a cross-sectional width of the bottom.

5. The display panel of claim 4, wherein the plurality of ring grooves are arranged at intervals from a position close to the hole region to a position away from the hole region.

6. The display panel of claim 1, wherein the organic insulating layer comprises a planarizing layer, a pixel defining layer, and a spacer layer stacked, the inorganic insulating layer comprises a buffer layer, a gate insulating layer, and an interlayer insulating layer, the ring groove penetrates at least one of the planarizing layer, the pixel defining layer, the spacer layer, the buffer layer, the gate insulating layer, or the interlayer insulating layer.

7. The display panel of claim 1, wherein the side wall of the ring groove is a flat surface or a curved surface, or a stepped structure.

8. A display device comprising the display panel of claim 1 and a camera component, wherein the hole region is disposed in a position of the display panel corresponding to the camera component;
   wherein the display panel further comprises the display region, and the perimeter region, the perimeter region surrounds the hole region, the display region surrounds the perimeter region;
   wherein the camera component is disposed on a back of the display panel corresponding to the hole region, the camera component is configured for photographing objects positioned at a side of the display panel facing away from the camera component.

9. A display panel, having a display region, a perimeter region, and a hole region, wherein the perimeter region surrounds the hole region, and the display region surrounds the perimeter region;
   wherein the display panel comprises an inorganic insulating layer, an organic insulating layer, an organic light emitting layer and a film packaging layer stacked on a base substrate, the organic light emitting layer is disposed in the display region, and the film packaging layer comprises an inorganic layer and an organic layer stacked; and
   wherein at least one ring groove is formed in a portion of the inorganic insulating layer in the perimeter region, a boundary of the ring groove is one or a combination of two or more of a straight line, an arc line, and a polyline, a boundary of the organic insulating layer is on a side of the ring groove close to the display region, a portion of the film packaging layer corresponding to the ring groove is joined to the inorganic insulating layer through a side wall of the ring groove and a bottom of the ring groove, and a boundary of the organic layer is out of the hole region, the at least one ring groove comprises a plurality of ring grooves, and depths of the plurality of ring grooves are gradually increased from a side near the hole region to a side far away from the hole region.

10. The display panel of claim 9, wherein a portion of the inorganic insulating layer close to the hole region is a stepped structure.

11. The display panel of claim 9, wherein the boundary of the organic layer is in the ring groove, or the boundary of the organic layer is on the side of the ring groove close to the display region.

12. The display panel of claim 9, wherein a cross-sectional width of an opening of the ring groove is less than a cross-sectional width of the bottom.

13. The display panel of claim 12, wherein the plurality of ring grooves are arranged at intervals from a position close to the hole region to a position away from the hole region.

14. The display panel of claim 9, wherein the organic insulating layer comprises a planarizing layer, a pixel defining layer, and a spacer layer stacked, the inorganic insulating layer comprises a buffer layer, a gate insulating layer, and an interlayer insulating layer, the ring groove penetrates at least one of the planarizing layer, the pixel defining layer, the spacer layer, the buffer layer, the gate insulating layer, or the interlayer insulating layer.

15. The display panel of claim 9, wherein the side wall of the ring groove is a flat surface or a curved surface or a stepped structure.

* * * * *